United States Patent [19]
Barazilai et al.

[11] Patent Number: 4,727,313
[45] Date of Patent: Feb. 23, 1988

[54] FAULT SIMULATION FOR DIFFERENTIAL CASCODE VOLTAGE SWITCHES

[75] Inventors: Zeev Barazilai, Millwood; Vijay S. Iyengar, Peekskill; Barry K. Rosen, Stormville; Gabriel M. Silberman, Briarcliff, all of N.Y.

[73] Assignee: International Business Machines Corporation, Armonk, N.Y.

[21] Appl. No.: 709,612

[22] Filed: Mar. 8, 1985

[51] Int. Cl.$^4$ .............................................. G01R 31/28
[52] U.S. Cl. ............................ 324/73 R; 324/158 R; 371/23
[58] Field of Search ................. 324/73 R, 158 R; 371/23; 364/578

[56] References Cited

U.S. PATENT DOCUMENTS 3,715,573  2/1973  Vogelsberg ........................ 371/23
4,204,633  5/1980  Goel .................................. 371/23

FOREIGN PATENT DOCUMENTS 3221819  2/1984  Fed. Rep. of Germany ........ 371/23

OTHER PUBLICATIONS

Whitney, G. E.; "Algebraic Fault..."; IEEE Trans. on Computers; vol. C-20; No. 2; 1971; pp. 141-145.
Ulrich, E.; "High Speed Fault Simulation with Vectors and Scalars"; 17th Design Automation Conference Proceedings; Minneapolis, Minn.; Jun. 23, 24, 25, 1980, (ACM Order No. 477800), pp. 374-380.

Primary Examiner—Ernest F. Karlsen
Attorney, Agent, or Firm—Sughrue, Mion, Zinn, Macpeak, and Seas

[57] ABSTRACT

A method of simulating a differential cascode voltage switch circuit (domino circuit) by replacing each switch-level logic tree by a three-section Boolean tree. In each section, a switch is replaced by an AND gate. The first and third section pass signals in one direction and the second section passes signals in the opposite directions. The three sections are interconnected end to end. Various faults can be simulated by holding selected internal signals at faulty values.

9 Claims, 8 Drawing Figures

FAULT SIMULATION FOR DIFFERENTIAL CASCODE VOLTAGE SWITCHES

TECHNICAL FIELD

The invention relates generally to integrated circuits. In particular, the invention relates to a method of representing differential cascode voltage switches by Boolean gates, particularly for purposes of fault simulation.

BACKGROUND ART

When integrated circuits are manufactured, there is typically a substantial probability that a particular chip will not function as designed. Because of minor manufacturing variabilities, a given chip may not provide the correct outputs for a particular set of inputs. Such faults often occur randomly from one chip to the next. Accordingly, standard practice is to subject each chip to a test pattern and then to measure the output. Pomeranz et al in U.S. Pat. No. 3,927,371 applies the test pattern to a physical circuit and also to a computer simulation of the circuit and compares the results. However, it is fairly common that a fault is manifested only for a particular test pattern. For relatively simple integrated circuits, such as flip-flops, it would be possible to provide a series of test patterns that would test all possible combinations of input patterns. Thus, such a simple chip would be completely tested. However, advanced integrated circuits may use a very large number of input variables. This is particularly true when the integrated circuit includes memory elements so that the inputs of one cycle are tested only in subsequent cycles. Although it may be theoretically possible to completely test all input patterns, even the fastest automated testers would not be able to complete the testing in a reasonable time, more or less, at a low cost. Accordingly, it is desirable that during the design of an integrating circuit, a sequence of test patterns are generated which will catch all possible faults in the circuit. The number of test patterns should be reduced to as low a number as possible in order to reduce the testing costs. This type of fault simulation to determine testability is described by Chao et al. in U.S. Pat. No. 3,775,598. The generation of these test patterns requires a knowledge of the design of the circuitry as well as a knowledge of the likely faults that will occur in the circuit.

Fault simulation requires a workable model of the integrated circuit and possible faults are then inserted into the model, corresponding to possible faults in the real chip. Then a test pattern is generated which would catch that particular fault, that is, the test pattern generates one output with the faultless model and another output when the model includes the fault. This pattern is used in the testing of the actual integrated circuit to determine if the circuit is faulty. Obtaining the required test pattern is non-trivial because many faults will provide correct outputs for a large fraction of input patterns. Goel in U.S. Pat. No. 4,204,633 discloses a method of generating a test pattern that makes an inserted fault visible at the outputs. Needless to say, a substantial number of test patterns may still be required to catch all or substantially all faults. But the intelligent choice of test patterns substantially reduces the costs of testing or, alternatively, increases the coverage (i.e. the percentage of detected faults) for a given number of test patterns.

There are various levels of abstraction for the circuit model that can be used in the fault simulation. A general description of simulators of different levels is contained in a technical article entitled "A System Engineer's Guide to Simulators" by Werner et al appearing in VLSI Design, February 1984, pp. 27-31. One type is described by Timoc in U.S. Pat. No. 4,308,616 who adds a fault inserter to physical circuits.

Perhaps the conceptually simplest is the switch level. The switch-level representation of a circuit is an interconnection of transistors and the like. The type of transistor, whether bi-polar or MOS, depends upon the technology being used in the integrated circuit. Faults are fairly easily inserted into the switch level representation. However, once all the transistors are interconnected according to the design of the chip, there results a very complex, non-linear circuit. Such a switch level circuit is difficult to evaluate for the relation of inputs to outputs.

Another type of representation is a Boolean model in which Boolean gates, such as AND or OR gates, are used. A Boolean circuit is much easier to evaluate mathematically. The Boolean model may be more complex than the corresponding switch-level model, but once the model has been set up, sophisticated and efficient computer simulations are available.

Many bi-polar circuit elements can be readily converted to Boolean equivalents. However, MOS circuit elements are much more difficult to transform to a Boolean representation with the proper simulation of MOS faults.

One recently developed type of MOS circuit is a differential cascode voltage switch (DCVS). This type of circuit is disclosed by Heller et al in a technical article entitled "Cascode Voltage Switch Logic Family" appearing in Proceedings of IEEE International Solid-State Circuits Conference, Feb. 22-24, 1984, San Francisco, CA. This type of circuit is also described in patent application Ser. No. 554,146 filed Nov. 21, 1983 by W. R. Griffin et al. now U.S. Pat. No. 4,570,084. An example of a DCVS circuit is shown in FIG. 1. The circuit consists of any number of logic trees 10, each with an associated buffer and precharge circuit 11. The combination of a logic tree 10 and its buffer and precharge circuit 11 will be called a logic module. The buffer and precharge circuits 11 are generally identical but the internal structure of the logic trees 10 may be different. The DCVS circuit relies upon the presence of complementary signals at all points. Each primary input has a complement and true version $PI0_i$ and $PI1_i$. The output of a logic module including the tree $F_i$ are complement and true versions $F0_i$ and $F1_i$ of the same logic signal. The inputs to the logic trees 10 are either the complementary versions of the primary inputs $PI0_I$ and $PI1_i$ or the complementary versions of the outputs $F0_i$ and $F1_i$ of different trees, collectively called major nets. The interconnections shown in FIG. 1 are purely for sake of example to demonstrate the variety available.

The details of the buffer and precharge circuit 11 are shown in FIG. 2 and its effect upon the logic tree 10 will now be described. The logic tree has a complement tree output T0 and a true tree output T1. Two upper precharge p-channel switches 12 and 14 separate the complement and true ouputs T0 and T1 from a positive voltage supply. A lower n-channel precharge switch 16 separates the grounding node R of the logic tree 10 from the ground. In a precharge period, the precharge signal controlling the precharge switches 12-16 goes low thus isolating the logic tree 10 from ground but connecting it to the positive power supply. Thus the two tree outputs T0 and T1 are charged.

The true tree output T1 is connected through a CMOS inverter of a p-channel switch 18 and a n-channel switch 20 to a true output node F1. The signal on the true output node F1 is fed back to the true tree output T1 through a p-channel feedback switch 22 connected to the positive voltage supply. The feedback switch 22 is a weak gate such that any substantial signal on the tree output T1 causes the feedback circuit to follow that signal. The feedback switch 22 compensates for leakage from the tree output T1 to ground and for signal fluctuations. Thus during the precharge period, the high signal on the precharged tree output T1 causes the true output node F1 to go low.

The complement tree output T0 has similar circuitry connecting it to a complement output node F0. In a normally functioning circuit, the signals on the tree outputs T0 and T1 are complementary to each other as are the output nodes F0 and F1. The CMOS inverters cause the output nodes F0 and F1 to be complementary to their corresponding tree outputs T0 and T1.

The logic tree 10 is implemented in NMOS, that is, with n-channel MOS switches. The logic tree 10 is controlled by major nets $G0_1$, $G1_1$, $G0_2$ and $G1_2$ of any even number. In normal operation, $G0_1$ is complementary to $G1_1$ and $G0_2$ is complementary to $G1_2$. As previously described, the major nets may be either primary inputs $PI0_i$ and $PI1_i$ to the DCVS circuit or may be connected to the output nodes F0 and F1 of a different logic tree.

The structure of the logic tree 10 depends on which logical function of its major net inputs it is designed to represent. An example of a logic tree is presented in FIG. 3. This logic tree 10 is seen to consists of three interconnected differential pairs 24 each controlled by complementary major nets $G0_i$ and $G1_i$. This particular tree structure is chosen for sake of illustration only. The major nets to the different differential pairs 24 may be the same. The important thing is that, in a normal circuit for any signal value on a major net, one and only one switch in a differential pair 24 is conducting. Furthermore, as should become apparent by tracing paths from the grounding node R upward, for any combination of signals on major nets $G0_i$ and $G1_i$ there is one conducting path only either from the complement tree output T0 or from the true tree output T1 to the grounding node R. These facts are true in a faultless circuit for which the switches are properly operating and the major net $G0_i$ is complementary to the major net $G1_i$.

Thus the fundamental building block of a logic tree 10 is the differential pair 24 shown in more detail in FIG. 4. The differential pair 24 consists of two n-channel switches 26 and 28, the gate electrodes of which are controlled by complementary major nets G0 and G1. The sources of both switches 26 and 28 are connected together to a common input source S. The drains of the two switches 26 and 28 are the output drains D0 and D1. In normal operation, regardless of the value of the signal on the major net G0, one of the two switches 26 and 28 is conducting and the other is non-conducting.

When the tree output nodes T0 and T1 have been properly precharged, once the lower precharge switch 16 is closed, either the tree output node T0 or the tree output node T1 is discharged, depending on the signal values of the major nets. This discharging is performed in what is called the evaluation phase. After evaluation, the signal on the tree output node T0 should be complementary to the signal on the node T1.

The rules for the interconnections of the differential pairs 24 are as follows. The major nets $G0_i$ and $G1_i$ are either primary inputs or are derived from the tree outputs T0 and T1 of other trees. These majors nets G0 and G1 have to be the true and complement forms of a single variable. The outputs D0 and D1 of a differential tree can only be connected to the input S of a single differential pair 24 at a higher level in the tree 10 or to a single tree output T0 or T1. The input S of a differential pair 24 can only be connected to the outputs D0 or D1 of one or more lower differential pairs in the tree 10 or to the grounding node R.

Also, the outputs D0 and D1 of different differential pairs 24 can be combined or dotted together. This dotting is used to share sub-trees and thus to reduce the number of differential pairs 24 to be perform the required logic function. It should be noted that the dotting at the tree outputs T0 and T1 and perhaps at other internal nodes results in a structure which is not strictly a tree, at least in the graph-theoretic sense.

During the precharge phase, because the tree outputs T0 and T1 are both held at the positive voltage supply, the output nodes F0 and F1 are both low or logic zero during the precharge. As a result, all the switches in the logic tree are non-conducting during the precharge.

DCVS circuits have many advantages. However, they suffer the previously described difficulty that they are composed of MOS switches and therefore are very difficult to stimulate as Boolean gates.

SUMMARY OF THE INVENTION

Accordingly, an object of this invention is to provide a Boolean level representation of a differential cascode voltage switch circuit.

A further object of this invention is to stimulate faults which correspond to possible faults in the real chip in a Boolean level representation of a DCVS circuit.

The invention can be summarized as a Boolean representation of a DCVS circuit in which each switch-level logic tree is replaced by a three-section Boolean logic tree. Each logic switch is replaced by an AND gate with one of its inputs control by the major net of the gate it represents. In the first section, of the tree the other input of the AND gates are connected to the inputs of the differential pair and the outputs of the AND gates are connected to the outputs of the differential pairs. The two outputs of the first tree section are connected as two inputs to the second tree section. The other inputs to the AND gates in the second section are the corresponding outputs of the differential pair. The two outputs of the paired AND gates are joined in an OR gate, the output of which is connected to the input connection of the differential pair. The one significant output of the second section is connected to the one input of the third section. The third section is similar to the first section except that the input to a differential pair is lead to an input of an OR gate, the other input of which is connected to the output of the corresponding OR gate in the second section. Faults are inserted into all corresponding places in the three sections. For some classes of faults, only the first section is required.

DETAILED DESCRIPTION OF THE PREFERRED EMBODIMENTS

Figure 1:
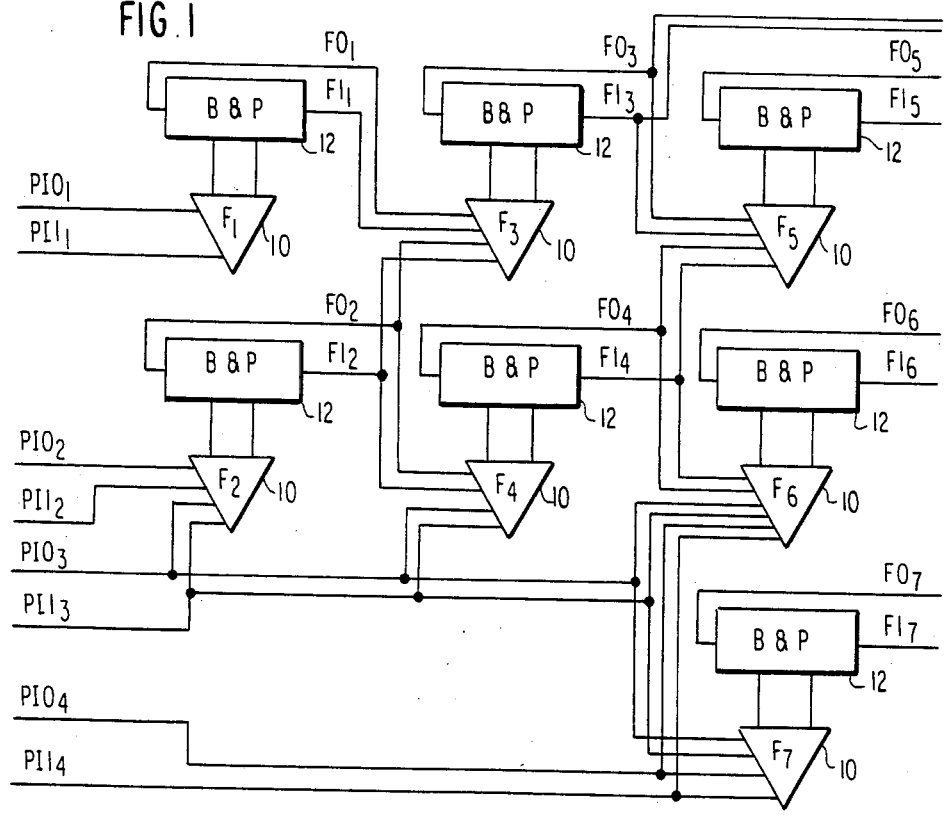
FIG. 1 is a schematic illustration of a DCVS circuit.
Figure 2:
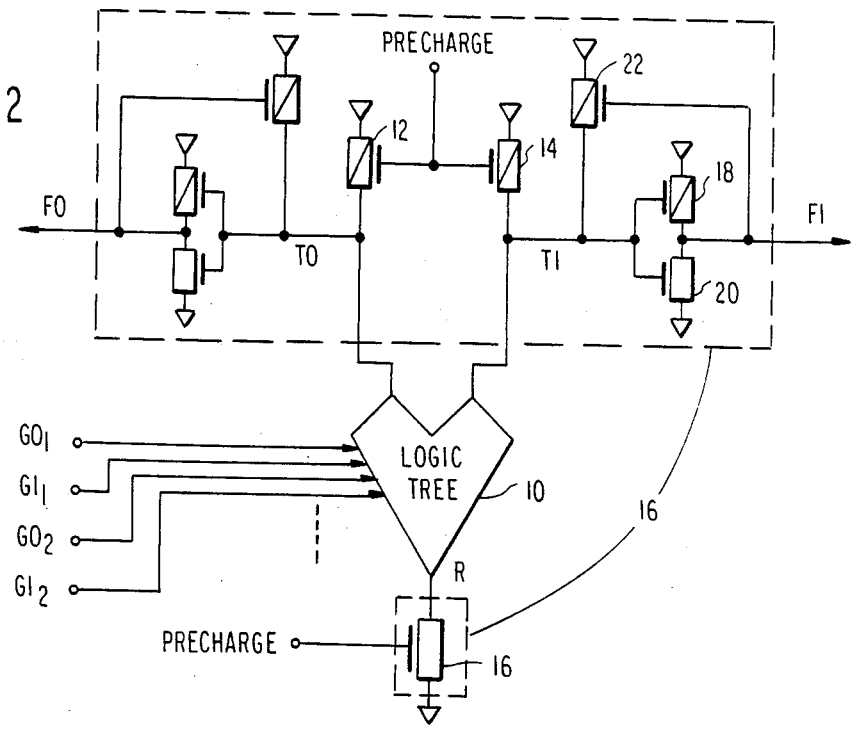
FIG. 2 is a schematic representation of a logic tree and its associated buffer and precharge circuit for a DCVS circuit.

The Boolean model of the differential cascode voltage switch (DCVS) circuit for this invention will be chosen to simulate several type of faults. These faults are considered to be among the most important in a DCVS. The selected faults are located in both the logic tree 10 and the buffer and precharge circuit 11. The model will be based on the assumption that only a single simulation fault is occurring in the entire DCVS circuit. The selected simulation faults are:

1. A switch 26 or 28 in a logic tree 10 is stuck open or non-conducting regardless of the signal G0 or G1 on its gates.

2. A switch 26 or 28 in a logic tree 10 is struck closed or conducting regardless of the signal G0 and G1 on its gate.

3. The signal on an output node F0 or F1 of a buffer and precharge circuit 11 is slow to fall. That is, when an output node F0 or F1 is designed to transition from a 1 to a 0, it eventually does but requires an excessively long time.

4. Signal on output node F0 or F1 of a buffer and precharge circuit 11 that is stuck at 0 regardless of the value of the corresponding signal at the tree output T0 or T1.

5. A signal at an output node F0 or F1 that is stuck at one regardless of the signals at T0 or T1.

The simulation faults in the buffer and precharge circuit 11 can be used to simulate a number of different physical faults in the switches of that circuit. The upper part of the buffer and precharge circuit 11 can be divided into two symmetric halves, one driving the complement output node F0 and the other the true output node F1. Only the faults in the half driving the true output node F1 will be specifically analyzed here although a corresponding explanation applies to the other half.

Table 1 shows the response of the module in the presence of this fault. The first physical fault to be modeled is the switch 14 stuck open. The fault is exposed only when the major net inputs to the logic tree 10 attempts to produce a logic 1 followed by a logic 0 on the true output node F1. Note that the output during the precharge phase is not considered as an observable quantity. This fault is simulated as a slow-to-fall fault on the true output node F1. There is some inaccuracy in this simulation, as will be explained below, but the model nonetheless is useful for simulating the sequential behavior caused by stuck open switches.

TABLE 1

| F1 Old value | F1 faultless (current) | F1 faulty (current) Precharge | F1 faulty (current) post-firing | fault exposed? |
|---|---|---|---|---|
| 0 | 0 | 0 | 0 | No |
| 0 | 1 | 0 | 1 | Yes |
| 1 | 0 | 0 | 1 | No |
| 1 | 1 | 0 | 1 | Yes |

The second physical fault to be modeled is the switch 20 stuck open. The output of all sequential combination of logic tree inputs in presented in Table 2. Once again, this fault can be simulated as a slow-to-fault on the true output node F1.

TABLE 2

| F1 Old value | F1 faultness (current) | F1 faulty (current) Precharge | F1 faulty (current) post-firing | fault exposed? |
|---|---|---|---|---|
| 0 | 0 | 0 | 0 | No |
| 0 | 1 | 0 | 1 | No |
| 1 | 0 | 1 | 1 | Yes |
| 1 | 1 | 1 | 1 | No |

The third type of fault to be simulated is the switch 18 stuck open. The response of the true node output F1 in the presence of this fault is given in Table 3. This failure can be simulated as a stuck-at-zero on the true output node F1. A single input pattern of primary inputs that would normally produce a logical one on the true output node F1, which in turn propagates to the outputs, suffices to detect this fault. The true output node F1 is instead forced to the stuck-at value of zero. The precharge phase serves only as an initialization pattern and is not required in the actual fault simulation.

TABLE 3

| F1 Old value | F1 faultless (current) | F1 faulty (current) Precharge | F1 faulty (current) post-firing | fault exposed? |
|---|---|---|---|---|
| 0 | 0 | 0 | 0 | No |
| 0 | 1 | 0 | 0 | Yes |
| 1 | 0 | 0 | 0 | No |
| 1 | 1 | 0 | 0 | Yes |

The fault of the feedback switch 22 being stuck open will not be simulated. The switch 22 is added to the buffer and precharge circuit 11 in order to remove glitches that could occur due to sharing of the precharge among a large number of internal nodes in the logic tree 10. A stuck-open fault on the switch 22 would essentially reintroduce the potential glitch problem.

The lower precharge switch 16 prevents spurious discharge during the precharge phase. If this switch 16 is stuck closed or conducting, this failure introduces the potential for such a spurious discharge. This discharge could result in both the output nodes F0 and F1 assuming a logic 1 in some but not all situations. This problematic fault will not be simulated.

If the lower precharge switch 16 is stuck open, this failure will prevent both the tree outputs T0 and T1 from discharging. As a result, both output nodes F0 and F1 are stuck at zero. This fault need not be simulated because it is dominated by the stuck-at-zero fault on the true output node F1 and the stuck-at-zero fault on the complement output node F0.

The effect of stuck-closed faults on the switches 14, 18, 20 and 22 is more complex and has to be analyzed considering the various switch sizes or dimensions. These faults will not be simulated. Modeling a switch that is stuck-open by a resultant slow-to-fall fault on an output node F0 or F1 requires some more explanation. As explained above, the slow-to-fall fault is tested by generating two patterns of primary inputs. The first pattern drives the output node F1 to 1. The second pattern normally drives the output node F1 to 0. If the output node F1 instead stays at 1 for the second pattern and this variation propagates to an output of the DCVS circuit, then the testing detects the fault. Thus, the simulation for testing the switch 14 being stuck-open is to program a sequence of two patterns which drive the output node F1 to 1 at a time T and to 0 at a time T+1 and then to test for the output node F1 being stuck at 1 at time T+1.

The slow-to-fall fault model requires that the actual chip testing be performed at time intervals of the order of the time that the signal fails to fall. However, the upper precharge switch 14 being stuck-open means that the true tree output T1 is not being precharged. The inability to precharge the tree output T1 implies that the true output node F1 will act stuck-at-one for a considerable time after being legitimately one. It is difficult to determine how long the output node F1 does act as stuck-at-one.

In using the slow-to-fall model, we are being pessimistic. The actual faults, such as the upper precharge gate 14 being stuck-open, are easier to physically test than the modeled faults, such as the output node F1 being slow to fall. But a pessimistic model can be very useful since the major concern in fault modeling is to simulate a test protocol and to verify that a high coverage of faults is obtained. A pessimistic model will calculate a lower coverage than the correct coverage obtained in physical testing. Accordingly, we know that the actual coverage will be at least as good as the coverage calculated in the pessimistic model. Furthermore, the pessimistic model will identify the faults that are not determined to be tested by the test protocol according to the pessimistic but simple model. The remaining, relatively few faults that are not known to be tested can be simulated in a more realistic and expensive model to determine if the test protocol does in fact test them. The realistic model is reserved for those few faults that require the more realistic and more expensive model.

Figure 5:
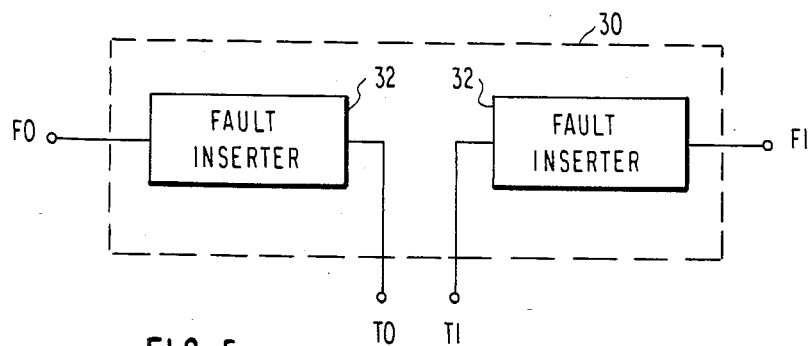
FIG. 5 is a schematic representation of the Boolean model of the buffer and precharge circuit, according to the invention.

The Boolean model for the buffer and precharge circuit 16 is shown in the buffer and precharge model 30, illustrated in FIG. 5. A fault inserter 32 is placed between the complement tree output T0 and the complement output node F0 and another fault inserter 32 is similarly placed between the true output T1 and the true output node F1. In a faultless circuit, the fault inserter 32 merely passes whatever signal is presented to it. However, a fault can be selectively inserted onto a net by the fault inserter 32 which then holds its output to the faulted value regardless of the value of its input. In a single fault simulation, only one fault inserter 32 is simultaneously activated. The inserted fault can be either a stuck-at-zero, a stuck-at-one or a slow-to-fall fault. One point should be discussed now. The fault inserter 32 does not invert a non-faulted signal as does the CMOS inverter of the switches 18 and 20. However, the absence of the inverter is compensated by the choice of representation for the value of the grounding node R. The ground voltage is represented by 1 or true at the Boolean level. Thus, the Boolean values for the tree outputs T0 and T1 are opposite the switch level values.

The modeling of the logic tree 10 is a much more difficult problem. The logic tree can have any form as long as it conforms to the rules for a DCVS circuit. The resultant logic trees are not only of a general configuration but they may also be very large. The complexity of a Boolean representation of a generalized circuit, not necessarily a DCVS circuit, increases very rapidly with the number of switches within that circuit. This invention, however, takes advantage of some unique properties of DCVS to reduce the level of complexity.

Two types of physical faults within the logic tree 10 will be modeled.

1. The first type of fault to be modeled is a switch 26 or 28 that is stuck open or non-conducting. If the faulty switch is in the discharge path between the grounding node R to either the complement or true tree output T0 or T1 for the combination of major nets supplied applied to the tree 10, then no discharge will occur and, because of the CMOS inverter, both the complement and true output nodes F0 and F1 will be at logic 0. The logic tree 10 will produce the correct values on the output nodes F0 and F1 for all major net inputs for which the faulty switch is not in the normal discharge path 2. The second fault to be modeled is for a switch 26 or 28 in the logic tree 10 that is stuck closed. Consider an input pattern of major nets which normally result in the true tree output node F1 to be a logical 1(0). This means that this particular input pattern results in a discharge path between the grounding node R to the tree output T1(T0). The faulty switch stuck closed could cause a second discharge path to the other tree output T0(T1). If there are discharge paths to both the tree outputs T0 and T1, then both the output nodes F0 and F1 will be at logical 1. If the particular input pattern does not produce a second discharge path to the other tree output T0(T1), the logic module will produce the correct functional outputs on the output nodes F0 and F1, even in the presence of this fault.

Figure 4:
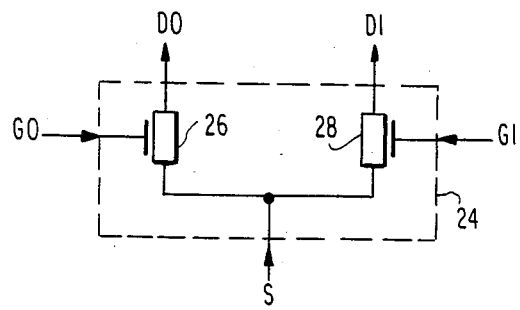
FIG. 4 is a schematic representation of a differential pair.

No other types of faults will be included in the present model. In particular, it is assumed that the interconnections between the switches and between the modules are faultless, so that the input to one switch can be equated to the output of the switch to which it is connected. The stuck-open and stuck-closed faults in the logic tree will be identified with their gate inputs stuck at some value. Referring to FIG. 4, the n-channel switch 26 being stuck open is equivalent to the major net input G0 on its gate being stuck at 0. Similarly, the switch 26 being stuck closed is equivalent to the net G0 being stuck at 1. Thus, just as in the case of the buffer and precharge model 30, the fault is inserted on the interconnecting line. In this case, the fault is inserted on the major net input to the faulty switch. Such faults will be called 0-faults and 1-faults for stuck-at-0 and stuck-at-1, respectively. A B-fault is a generalization and will be a 0-fault or a 1-fault depending on whether B=0 or B=1.

The model for faults within the logic tree will be based upon a series of mathematical theorems. This mathematical approach is probably necessary in view of the nearly infinite variety of logic trees. The inventors have proved these theorems but the proofs will not be presented here. Where possible, an intuitive justification will be provided for the validity of the stated theorem.

THEOREM ONE. If a DCVS circuit has only B-faults for fixed B=0 or B=1, then the signal values on major nets in the faulty DCVS circuit are in near agreement with the correct values. By near agreement is meant that the only kind of wrong value that can appear on a major net is B when the correct value is NOT(B). Any major net that should carry B will carry B despite the faults.

A fundamental property of a faultless DCVS circuit is described as follows. To determine the signal values on the output nodes F0 and F1 after the evaluation phase, the fate of the precharge on the corresponding tree output T0 or T1 must be determined. Does the precharge persist after the evaluation phase or is it discharged to a 0 signal by a conducting path to the grounding node R of the logic tree 10? Beginning at the grounding node R and moving upwards to the tree outputs T0 and T1 (where upwards matches the upward direction of FIG. 3), a conductive path is marked through the logic tree 10. Whenever the source input S of a differential pair 24 is marked as reached by a conducting path from the grounding node R, one of the drain outputs D0 or D1 is marked as being in a conductive path depending on the values of the major nets G0 and G1. Eventually, the conducting path reaches one of the tree outputs T0 or T1. This marked tree output is part of a conductive path to the grounding node R so that the signal on that marked tree output T0 or T1 is discharged. The signal on the other or unmarked tree output T0 or T1 does not have a conducting path so that it is not discharged. A single upward pass through the logic tree 10 suffices to compute the stage of every major net in the faultless DCVS circuit. The following theorem extends this observation to faulty circuits.

THEOREM TWO. If a DCVS circuit is faultless or has only 0-faults, then the result of the evaluation phase of any module can be computed in one pass, upward through the logic tree 10 of the module. On the other hand, if a circuit has only 1-faults, then the result of the evaluation phase of any module can be computed in three passes up-down-up.

This property of DCVS circuits is quite unlike the behavior of other kinds of networks of bidirectional transistors. In the general case, the number of passes required rise approximately as the number of transistors in the switching network. For large networks, a large number of passes need to be allowed for. In contrast, it has been shown that DCVS circuits require at the most three passes. Theorem Two was proved using the following five lemmas.

LEMMA ONE. Let Fi be one of the output nodes F0 or F1 of the module and let Ti be the corresponding logic tree output T0 or T1. When the module is evaluated, the value of Fi is set to 1 if Fi is not stuck-at-zero and also one of the following is true: (a) there is a conducting path to the grounding node R to the output node Ti in the logic tree 10, (b) the output node Fi is stuck-at-1, or (c) the output node Fi is slow-to-fall and condition (a) was true for the previous firing. In all other cases, the value of the output node Fi is set to 0 when the module is evaluated.

LEMMA TWO. Considering the evaluation of any module in a faultless or 0-faulted DCVS circuit, if there is a conducting path from the grounding node R to one of the logic tree outputs Ti, then there is such a path that only moves upward. This lemma can be intuitively understood. If there is to be a conducting path that moves downward as well as upward, then the conducting path must enter a differential pair at one of the drain outputs D0 or D1 and also leave from the same differential pair 21 on the other drain output D1 or D0. Thus, both switches 26 or 28 must be conducting. If the circuit is faultless, then G0 is complementary to G1 and one and only one of the switches 26 and 28 is conducting. If there are only 0-faults, then the 0-faults will be manifested by both switches 26 being non-.pa conducting. It is only the presence of 1-faults that allows a path to turn from downward to upward.

LEMMA THREE. Consider the evaluation of any module in a faultless of 1-faulted DCVS circuit. From any internal node in the logic tree 10, there is a tree output Ti (either T0 or T1) for which there is a conducting path from the internal node to that logic tree output Ti such that this conducting path only moves upward.

LEMMA FOUR. Consider the evaluation of any module in a 1-faulted circuit. If there is a conducting path from the grounding node R to one of the tree outputs T0 or T1, then there is such a conducting path that only moves up-down-up.

The importance of Lemma Four is that even in a 1-faulted circuit the erroneous conducting path can be replaced by a path composed of three unidirectional sub-paths. By suitable interconnections between the passes, all possible required combinations of sub-paths can be modeled by three passes through the logic tree 10. It does not matter if there are additional parallel conducting paths having a large number of kinks between upwardly moving and downwardly moving sub-paths since the two-kink, three-sub-path conducting path provides the state at the tree output.

LEMMA FIVE. Consider the evaluation of any module in a 1-faulted DCVS circuit. If there is a conducting path from the grounding node R to one of the tree outputs Ti, then there is such a conducting path that only moves up-down-up. Moreover, the up-down-up path can be chosen to have its last upward sub-path end at a tree output.

Since Lemma Three has guaranteed that there will be a conducting path from any internal node in the logic tree to a tree output, the first turn in the up-down-up conducting path can be moved upward to that tree output.

Figure 6:
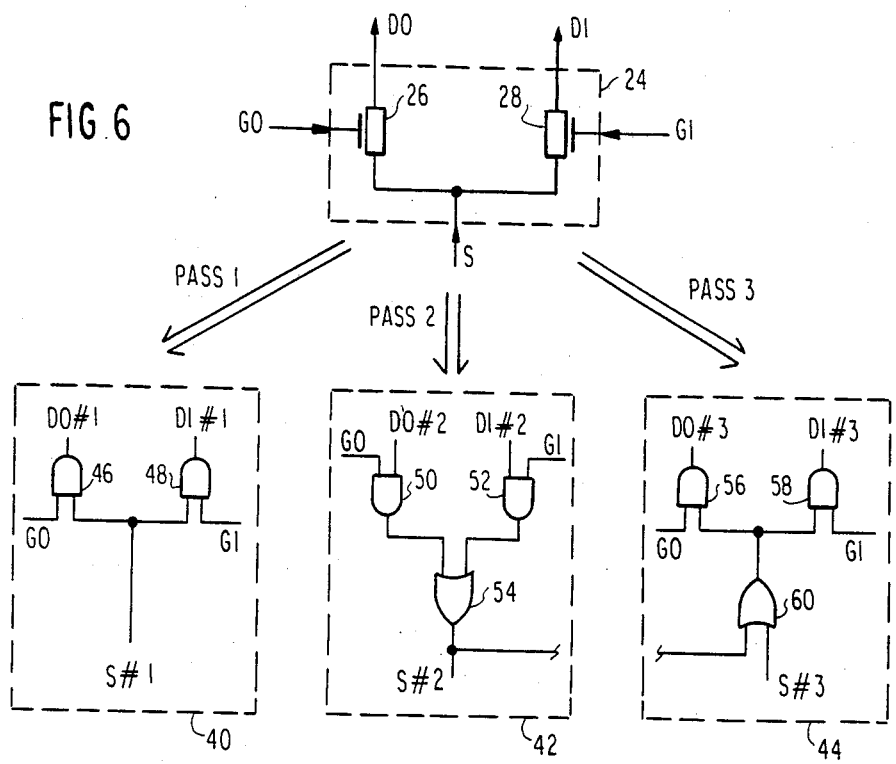
FIG. 6 is a schematic representation of the Boolean model of a differential pair, according to the invention.

Based upon the preceeding theorems, the following model, shown in FIG. 6 is presented. The switch-level representation of the differential pair is replaced by three Boolean circuits 40, 42 and 44, depending on whether it is the first, second or third pass in the Boolean tree. Pass one is an upward pass and the gates switches and 28 are replaced by respective AND gates 46 and 48. The interconnections between the first pass Boolean circuits are the same as the interconnections between the switch-level differential pairs 24, whether the interconnections are between differential pairs of the same logic tree 10 or the interconnections are the major nets of the primary inputs or the inter-tree connections from the tree outputs T0 and T1. That is, if the major net G0 or G1 is connected by an output node F0 or F1 of another logic tree 10 in the switch level DCVS circuit, then in the Boolean representation, the major net G0 or G1 is driven by the same output F0 and F1 as the other logic tree. The first pass provides for the evaluation of conducting paths from the grounding node R to the tree outputs T0 and T1.

The second pass is downward and the switch-level circuit 24 is replaced by the second-pass Boolean differential pair 42. Because the path is downward, the drains D0#2 and D1#2 are inputs to AND gates 50 and 52, corresponding to the switches 26 and 28. The outputs of the AND gates 50 and 52 are combined in an OR gate 54, the output S#2 of which corresponds to the source input S of the switch-level differential pair 24.

Once again, the interconnections of the drains D0#2 and D1#2 and the source S#2 are the same interconnections as for the drains D0 and D1 and the source S of the switch-level differential pairs 24. Additionally, however, the output of the OR gate 54 is separately led to the corresponding third-pass Boolean circuit 44 of the third pass. This additional connection is required because the downward sub-path of the up-down-up path does not necessarily extend to the grounding node R.

The third-pass Boolean circuit 44 for the third pass is similar to the Boolean representation 40 of the first pass. The switches 26 and 28 are replaced by AND gates 56 and 58. However, the source input S#3 is combined in an OR gate 60 with the output of the OR gate 54 of the corresponding second-pass Boolean circuit 42 of the second pass. As described before, this additional interconnection is required to allow for a downward-upward transition at an internal node of the logic tree 10.

Figure 7:
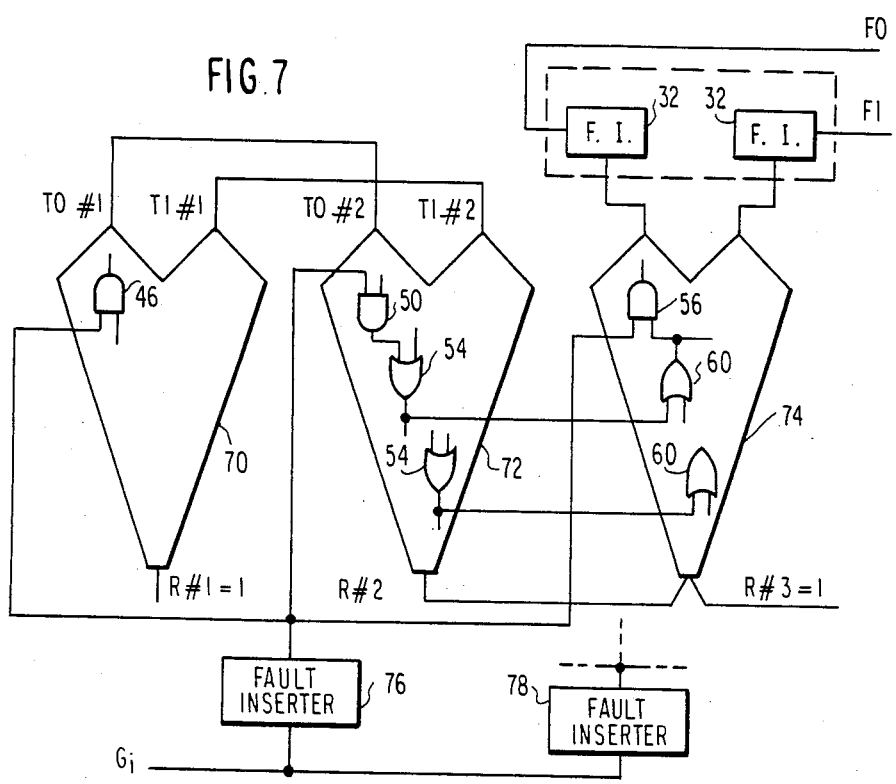
FIG. 7 is a schematic representation showing the interconnections of the Boolean models of FIGS. 5 and 6.
Figure 8:
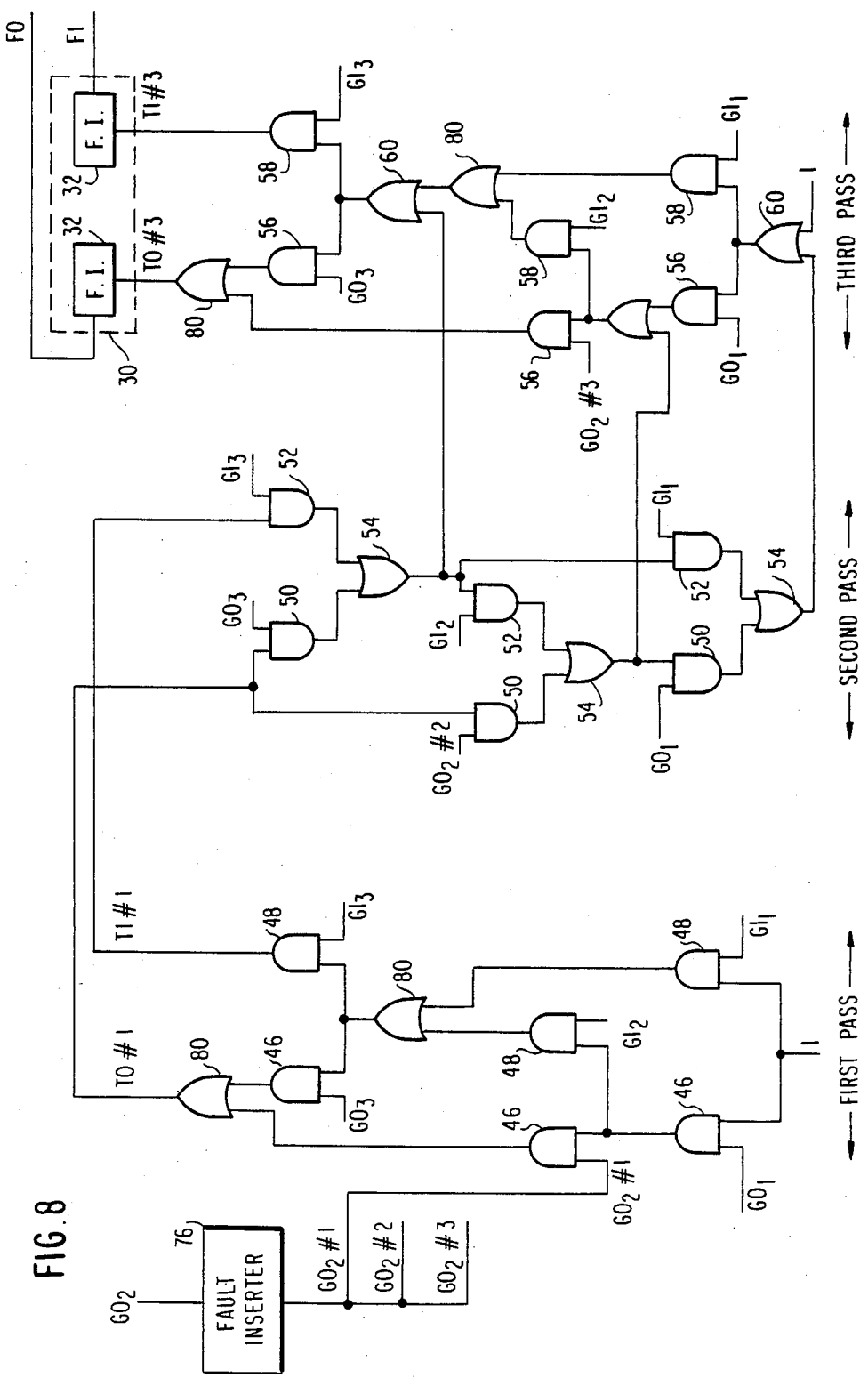
FIG. 8 is a detailed Boolean model for the exemplary switch-level circuit of FIG. 3.

The interconnections between the three passes is shown in FIG. 7. Only the modeling of a single switch 26 or 28 is shown. Similar AND and OR gates will be present for every switch 26 and 28 in the logic tree 10. There are three Boolean trees 70, 72 and 74 for the first, second and third passes respectively. The input to the grounding node R#1 of the first-pass Boolean tree 70 first pass are connected to corresponding Boolean outputs T0#2 and T1#2 of the second pass, used here as logical inputs. The grounding node R#2 of the second pass is an output of the second-pass Boolean tree 72 and is used as one of the logical inputs to the OR gate 60 of the bottom level differential pair 44 of the third-pass Boolean tree 74. The other input to this OR gate 60 is the Boolean grounding node R#3 and is set to 0 just as is R#1. Additionally, the OR gates 54 and 60 have separate interconnections between the second-pass Boolean tree 72 and the third-pass Boolean tree 74 for each switch 26 and 28 of the modeled switch-level logic tree 10. The tree outputs T0#3 and T1#3 are connected to the Boolean buffer and precharge circuit 30 with its two fault inserters 32.

It should be noted that the full three-pass model is required even if the fault is not in the logic tree if a major net input is a 1-fault.

If the modelled switch 26 or 28 is gated by a major net Gi, then a fault inserter 76 is placed between the major net Gi and the inputs to the corresponding AND gates of the Boolean trees 70, 72 and 74 of all three passes. The fault inserter 76 can insert a stuck-at-zero fault or a stuck-at-one fault. If the major net Gi controls multiple switches 26 and 28 in different differential pairs, then additional fault inserters 78 are included to simulate the faults at these additional switches. The fault, although inserted on the major net Gi, is not fault of the major net but is instead a fault of the controlled switch.

The model presented in FIG. 6 is for a single switch-level logic tree 10 and its associated buffer and precharge circuit 12. If there are multiple logic trees 10, as illustrated in FIG. 1, then each logic tree 10 is modelled by a corresponding structure of FIG. 6. The interconnections of FIG. 1 will be duplicated between the Boolean output nodes F0 and F1 and the major nets Gi of FIG. 6.

The interconnections within the Boolean logic trees need to account for the bidirectionality of dotted interconnections Dotting is modelled by a combination of OR gates and fan-out (one output driving multiple inputs). Examples will be provided later.

An inspection of FIG. 6 shows why the polarity of the signals on the Boolean tree outputs differ from the polarities of the signals on the switch-level tree outputs. First of all, it is assumed that the polarities of the major nets G0 and G1 and the polarity of the output nodes F0 and F1 are the same in the switch-level representation and the Boolean representation. That is, TRUE=1 and FALSE=0. At both the switch level and at the Boolean level, a 1 on a major net then closes the n-channel switch or AND gate that it controls. However, the grounding node R at the switch level is a 0 while the grounding nodes R#1 and R#3 are set to 1 or true at the Boolean level. As a result, closed switches at the switch-level pass a 0 to the corresponding tree output T0 or T1 while an enabled AND gate at the Boolean level passes a 1 to the corresponding tree output T0#3 or T1#3. The same comments apply to the polarity of the signals on the Boolean tree outputs T0#1 and T1#1 of the first-pass Boolean tree 70. Thus, no Boolean inverter is required in the buffer and precharge model 30. It should also be noted that the complete Boolean model could be equivalently implemented in complementary Boolean logic using NAND and NOR gates.

Figure 3:
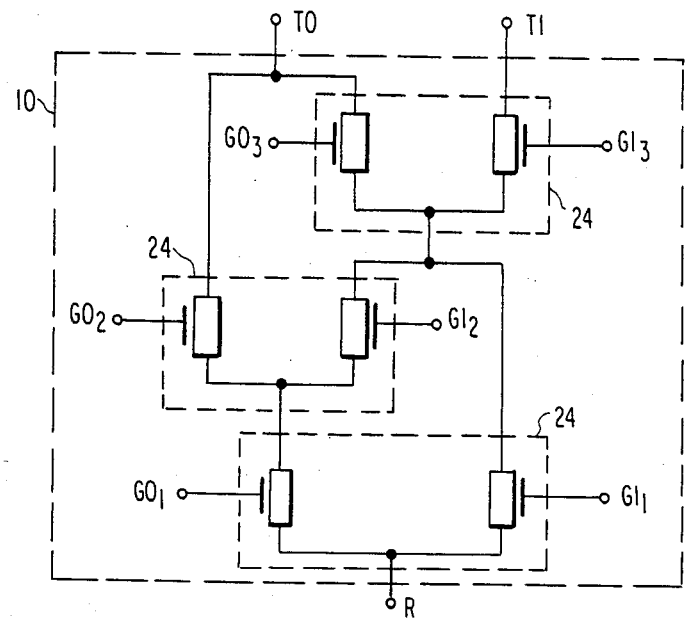
FIG. 3 is a schematic representation of an exemplary DCVS logic tree.

The above described model has been applied to the switch-level logic tree 10 of FIG. 3 and the resultant Boolean model is shown in FIG. 7. Only a single fault inserter 76 is shown for inserting a fault on the major net G0$_2$. It is to be understood that every major net has a similar fault inserter 76 although only one fault inserter is turned on for the single-fault model. In the model of FIG. 7, OR gates 80 are used for dotting or fan-in (multiple outputs driving one input) in the upward direction while the OR gates 54 are used for dotting or fan-in in the downward direction. When the fault inserter 76 inserts a 0-fault, the second and third passes are not necessary so that the buffer and precharge model 30 can be directly attached to the Boolean tree outputs T0#1 and T1#1 of the first pass.

It should be noted that Theorem One provided that a 0-fault on an input to a logic tree cannot result in a 1-fault on the logic tree output. As a result, no major nets in a 0-faulted circuit will both be 1, which would have required the three pass model. Similarly if a 0-fault is inserted by the fault inserter 32 in the buffer and precharge model 30, only the one-pass Boolean logic tree 70 is required. However, if the fault inserter 32 inserts a 1-fault, then any inputs on other logic trees connected to that fault inserter 32 will see a 1-fault. As a result, the full three-pass model is required.

It can be recognized that the model of FIG. 7 can be somewhat simplified because several of the AND and OR gates have one fixed input, a logical 1. However, these gates are retained to show the logical structure of the model. The Boolean model has been presented as a wiring diagram between various AND and OR gates. The model could be tested with physical logic gates. However, it is more likely that the simulation would be performed on a computer using Boolean arithmetic.

The invention and its claims extend to the computer simulation. For the computer simulation, the presented diagrams are intended as a graphical representation of the Boolean calculation. The AND and OR gates represent the Boolean AND and OR operations and the interconnections describe which calculational outputs are used as inputs of further Boolean calculations. In Boolean arithmetic, a 0 is FALSE and a 1 is TRUE. An example of a computer program for fault simulation at the Boolean level is described by E. Ulrich et al in a technical article entitled "High Speed Fault Simulation With Vectors and Scalars" appearing in 17th Design Automation Conference Proceedings, Minneapolis, Minn., June 23, 24, 25, 1980 (ACM Order No. 477800) pp. 374–380.

Having thus described our invention, what we claim as new and desire to secure by Letters Patent is:

1. A method for transforming a switch level representation of a circuit to a Boolean representation of said circuit, said switch level representation comprising one or more logic trees, each said tree comprising one or more differential pairs, each said differential pair comprising a first switch and a second switch, each said first switch having a first switch input and a first switch output, each said second switch having a second switch input and a second switch output, said first and second switch inputs of a different pair being connected to a common switch point, each said common switch point being connected to one of two switch outputs of at least one other differential pair or to a switch potential reference point, each said switch output being connected to either a common switch point of another differential pair or to a switch tree output; each first and each second switch of each differential pair being controlled by a first and a second major switch net respectively, intended to be of complementary values, said major switch nets being connected to either a primary input or a switch tree output of another switch tree, said method comprising the steps of:
   representing each switch by a Boolean gate in a first series interconnected similarly to said logic tree;
   representing each switch by a Boolean gate in a second series interconnected similarly to said logic tree;
   representing each switch by a Boolean gate in a third series interconnected similarly to said logic tree;
   interconnecting said first and second series at two points corresponding to said two switch tree outputs; and
   interconnecting said second and third series at points corresponding to said switch reference point and to said common switch points.

2. A method of simulating faults in a switch level representation of a circuit as recited in claim 1, further comprising the step of:
   holding the values of an input to a representing Boolean gate in each of said first, second and third series, to a faulty value, all said representing Boolean gates representing a faulty switch.

3. A smethod for transforming a switch level representation of a circuit to a Boolean representation of said circuit, said switch level representation comprising one or more logic trees, each said tree comprising one or more differential pairs, each said differential pair comprising a first switch and a second switch, each said first switch having a first switch input and a first switch output, each said second switch having a second switch input and a second switch output, said first and second switch inputs of a differential pair being connected to a common switch point, each said common switch point being connected to a switch output of at least one other differential pair or to a switch potential reference point, each said switch output being connected to either a common switch point of another differential pair or to one of two switch tree outputs, each switch tree output being an input to an inverting output circuit, each first and each second switch of each differential pair being controlled by a first and a second major switch net respectively, intended to be of complementary values, said major switch nets being connected either to a primary input or a circuit output of another switch tree, said method comprising the steps of:
   representing each said differential pair by a first Boolean block of a first AND gate and a second AND gate, first inputs of said first and second AND gates being connected together to a Boolean common point, and second inputs of said first and second AND gates being connected to first and second major Boolean nets respectively;
   interconnecting all Boolean blocks representing said differential pairs
   similarly to the interconnections of said differential pairs in said logic tree, wherein:
   a connection to a said switch common point is replaced by a connection to a said Boolean common point;
   a connection to a said first or a said second major switch net is replaced by a connection to a said first or a said second major Boolean net respectively;
   a connection to a said first or said second switch output is replaced by a connection to an output of a said first or a second AND gate respectively; and
   a connection between outputs of a plurality of switches and a switch common point or a switch tree output is replaced by connections from outputs of a plurality of first or second AND gates representing said plurality of switches to inputs of a first dotting OR gate and by a connection from an from an output of said first dotting OR gate to a Boolean common point representing said switch common point or switch tree output.

4. A method of simulating faults in a switch level representation of a circuit as recited in claim 3, further comprising the steps of:
   simulating a faulty first switch stuck open by holding the value of the second input of the first AND gate representing said faulty first switch at a FALSE value; and
   simulating a faulty second switch stuck open by holding the value of the second input of the second AND gate representing said faulty second switch at a FALSE value.

5. A method of simulating faults in a switch-level representation of a circuit as recited in claim 3, further comprising:
   simulating an output of said output circuit connected to said major net stuck at a low value by holding the value of the output of a first or a second AND gate or a first dotting OR gate connected to said switch tree output corresponding to the connection to said output circuit at a FALSE value.

6. A method for transforming a switch level representation of a circuit to a Boolean representation as recited in claim 3, further comprising the steps of:
   representing each said differential pairs by a second Boolean block and a third Boolean block, said second Boolean block comprising a third AND gate and a fourth AND gate, outputs of said third and fourth AND gates being inputs to a first OR gate, said third Boolean block comprising a fifth AND gate and a sixth AND gate, first inputs of said third and fifth AND gates being connected to said first major Boolean net, first inputs of said fourth and sixth AND gates being connected to said second major Boolean net, second inputs of said fifth and sixth AND gates being connected to an output of a second OR gate, a first input of said second OR gate being connected to an output of said first OR gate;

interconnecting all second Boolean blocks simulating differential pairs similarly to the interconnections of said differential pairs in said logic tree, wherein:

a connection to said switch common point is replaced by a connection to the output of said first OR gate; and a connection to said first or said second major switch net is replaced by a connection to a second input of said third or fourth AND gate respectively;

said method further comprising interconnecting all third Boolean blocks simulating differential pairs similarly to the interconnections of said differential pairs in said logic tree, wherein:

a connection to said switch common point is replaced by a connection to a second input of said second OR gate;

a connection to said first or second major switch net is replaced by a connection to said first or second major Boolean net respectively;

a connection to said first or second switch output is replaced by a connection to an output of a fifth or a sixth AND gate representing said first or second switch;

a connection between outputs of a plurality of switches and a switch common point is replaced by connections from outputs of a plurality of fifth or sixth AND gates representing said plurality of switches to inputs of a second dotting OR gate and by a connection from an output of said second dotting OR gate to a second input of said second OR gate; and a connection between outputs of a plurality of switches and a switch tree output is replaced by connections from outputs of a plurality of fifth or sixth AND gates representing said plurality of switches to inputs of a second dotting OR gate and by a connection from an output of said second dotting OR gate to said switch tree output;

said method further comprising;

interconnecting the outputs of the first and a second AND gates or first dotting OR gates representing said two tree outputs to second inputs of the third and fourth AND gates also representing switches with switch outputs connected to said two tree outputs.

7. A method of simulating faults in a switch level representation as recited in claim 6, further comprising the steps of:

simulating a faulty first switch stuck closed by holding the values of the second input of the first AND gate and of the first input of the third and fifth AND gates representing said faulty first switch at a TRUE value; and simulating a faulty second switch stuck closed by holding the values of the second input of the second AND gate and of the first inputs of the fourth and sixth AND gates representing said faulty second switch at a TRUE value.

8. A method of simulating faults in a switch level representation as recited in claim 6;

further comprising:

simulating an output of said output circuit connected to said major switch net stuck at a high value by holding the output of a fifth or a sixth AND gate or a second dotting OR gate corresponding to said switch tree output connected to said output circuit at a TRUE value.

9. A method of simulating faults as recited in claim 8, further comprising the steps of:

simulating an output of said output circuit being slow to transition by holding an output of said corresponding gate at a TRUE value in a second period when said output of said corresponding gate was TRUE in a preceeding first period.

* * * * *